United States Patent
Kawakami

(10) Patent No.: US 6,979,593 B2
(45) Date of Patent: Dec. 27, 2005

(54) METHOD OF MANUFACTURING A SEMICONDUCTOR DEVICE

(75) Inventor: Masaru Kawakami, Kodaira (JP)

(73) Assignees: Hitachi, Ltd., Tokyo (JP); Akita Electronics Systems Co., Ltd., Akita (JP)

( * ) Notice: Subject to any disclaimer, the term of this patent is extended or adjusted under 35 U.S.C. 154(b) by 175 days.

(21) Appl. No.: 10/372,942

(22) Filed: Feb. 26, 2003

(65) Prior Publication Data

US 2003/0190795 A1 Oct. 9, 2003

(30) Foreign Application Priority Data

Apr. 8, 2002 (JP) ........................................ 2002-105207

(51) Int. Cl.⁷ ......................... H01L 21/48; H01L 21/46; H01L 21/50
(52) U.S. Cl. ....................... 438/110; 438/113; 438/127; 438/464
(58) Field of Search ................................ 438/113, 114, 438/460–465

(56) References Cited

U.S. PATENT DOCUMENTS

| | | | | | |
|---|---|---|---|---|---|
| 4,722,130 | A | * | 2/1988 | Kimura et al. | 29/413 |
| 5,009,735 | A | * | 4/1991 | Ametani et al. | 156/241 |
| 5,641,714 | A | * | 6/1997 | Yamanaka | 438/14 |
| 6,215,179 | B1 | * | 4/2001 | Ohgiyama | 257/676 |
| 6,309,909 | B1 | * | 10/2001 | Ohgiyama | 438/112 |
| 6,451,671 | B1 | * | 9/2002 | Yamada | 438/460 |
| 6,555,418 | B2 | * | 4/2003 | Kurosawa et al. | 438/118 |
| 6,649,448 | B2 | * | 11/2003 | Tomihara | 438/113 |
| 6,713,851 | B1 | * | 3/2004 | Umehara et al. | 257/675 |
| 6,797,544 | B2 | * | 9/2004 | Sakai et al. | 438/121 |
| 2002/0019066 | A1 | * | 2/2002 | Iketani | 438/14 |
| 2002/0093076 | A1 | * | 7/2002 | Fujii et al. | 257/620 |

FOREIGN PATENT DOCUMENTS

JP           10-27836         1/1998

* cited by examiner

Primary Examiner—Michael Lebentritt
Assistant Examiner—Scott B. Geyer
(74) Attorney, Agent, or Firm—Miles & Stockbridge P.C.

(57) ABSTRACT

A semiconductor device is manufactured by covering a main surface of a wafer with protective tape, grinding a back side of the wafer to form an extremely thin wafer and affixing it to a dicing tape, dicing to form extremely thin semiconductor chips, picking up the chips and fixing each picked-up chip to a product forming area on a wiring substrate, removing the protective tape, performing wire bonding, covering the chips and wires of the wiring substrate with an insulating resin layer, forming bump electrodes on a back side of the wiring substrate, cutting the wiring substrate affixed to a support member together with the insulating resin layer, thereby forming plural semiconductor devices, and removing each semiconductor device from the support member.

13 Claims, 8 Drawing Sheets

METHOD OF MANUFACTURING A SEMICONDUCTOR DEVICE

BACKGROUND OF THE INVENTION

The present invention relates to a method of manufacturing a semiconductor device and more particularly to a method applicable effectively to a technique for manufacturing a thin semiconductor-device which comprises providing a substrate (wiring substrate) on a main surface of which are formed product forming portions(the chip mounting areas), orderly in longitudinal and transverse rows, mounting semiconductor chips as thin as 100 µm on the product forming portions respectively, connecting electrodes of the semiconductor chips with wiring lines of the wiring substrate through electrically conductive wires, covering the main surface side of the wiring substrate with an insulating resin layer, forming bump electrodes (salient electrodes) on a back side of the wiring substrate, and then dicing the wiring substrate together with the resin layer along boundaries between adjacent product forming portions.

As one of semiconductor device (semiconductor integrated circuit device) manufacturing techniques there is known a technique which comprises using a wiring substrate on a main surface of which are formed product forming portions orderly in longitudinal and transverse rows(in a matrix), mounting semiconductor chips on the product forming portions, respectively, connecting electrodes of the semiconductor chips with wiring lines of the wiring substrate through electrically conductive wires, covering the main surface side of the wiring substrate with an insulating resin layer, and then dicing the wiring substrate together with the resin layer along boundaries between adjacent product forming portions.

In Japanese Published Unexamined Patent Application No. Hei 10 (1998)-27836 there is disclosed a technique which comprises affixing a protective tape to a surface of a substrate after an operation inspection for functional elements, then grinding a back side of the substrate, affixing a dicing tape to the back side, dicing the substrate into plural functional elements to form chips, picking up the chips from the dicing tape, mounting each of the chips onto a predetermined package member through a paste material, allowing the paste material to cure, and thereafter removing the protective tape. According to this technique, a 620 µm thick substrate is subjected to back grinding into a 400 µm thick substrate. When picking up each chip from the dicing tape, the chip is pushed up with a single push-up pin and the chip is held by a flat collet.

SUMMARY OF THE INVENTION

For the purpose of thinning a semiconductor device the applicant in the present case has been studying a semiconductor device not larger than 0.5 mm in thickness with a semiconductor chip 100 µm or less in thickness incorporated therein. In this connection there is adopted a method wherein there is used a wiring substrate on a main surface of which are formed product forming portions orderly in longitudinal and transverse rows, and in the final stage of manufacture the wiring substrate is diced longitudinally and transversely into each product forming area.

FIG. 15 is a schematic sectional view of a semiconductor device studied prior to the present invention and FIG. 16 is a flow chart showing a method of manufacturing the semiconductor device.

As shown in FIG. 15, a semiconductor device 60 is made up of a substrate 61 of a wiring substrate structure, a semiconductor chip 62 fixed to a main surface (upper surface in the figure) of the substrate 61, electrically conductive wires 63 for connecting electrodes (not shown) formed on a surface of the semiconductor chip 62 with wiring lines (not shown) formed on the main surface of the substrate 61, a seal member, or a package, 64 which is formed of an insulating resin on the main surface of the substrate 61 so as to cover the semiconductor chip 62 and the wires 63, and bump electrodes (salient electrodes) 65 formed on a back side of the substrate 61. The bump electrodes 65 are formed on wiring lines (not shown) provided on the back side of the substrate 61. Since peripheral faces of the substrate 61 and the seal member 64 are cut faces resulting from dicing with a dicing blade, they are positioned on the same plane on each side.

The semiconductor device 60 constructed as above is manufactured for example in accordance with a flow chart shown in FIG. 16. That is, first there is provided a semiconductor wafer on a main surface of which are formed semiconductor chip portions for semiconductor chips orderly in longitudinal and transverse rows, and thereafter a protective tape is affixed to the whole of the wafer main surface (S301). Next, a back side of the wafer is subjected to grinding (back grinding: BG) so that the thickness of the wafer is reduced from 750 µm to 100 µm (S302).

Then, the protective tape is peeled from the wafer (S303) and a dicing tape is affixed to the back side of the wafer (S304). Thereafter, the wafer is cut longitudinally and transversely with a dicing blade (dicing: S305). The dicing with the dicing blade is performed along boundaries between adjacent semiconductor chip portions so that the dicing tape is cut halfway in its depth. Consequently, the semiconductor chips after the dicing are held on the dicing tape.

Next, there is provided a wiring substrate on a main surface of which are formed product forming areas orderly in longitudinal and transverse rows, the product forming portions constituting semiconductor devices respectively. Thereafter, the semiconductor chips on the dicing tape are picked up one by one and carried and fixed to semiconductor chip fixing portions in the semiconductor product forming areas (chip bonding: S306). Then, electrodes on the semiconductor chips and wiring lines on the wiring substrate are connected with each other using electrically conductive wires (wire bonding: S307).

Subsequently, an insulating resin layer is formed on the main surface of the wiring substrate so as to cover the semiconductor chips and the wires (resin layer forming: S308).

Next, bump electrodes (salient electrodes) are formed on a back side of the wiring substrate (S309). The bump electrodes are formed on wiring lines (electrodes) which are formed on the back side of the wiring substrate.

Thereafter, a support member is affixed to a main surface of the insulating resin layer and dicing is performed with the dicing blade along boundaries between adjacent product forming areas and from the wiring substrate to the support member through the insulating resin layer so that the support member is cut halfway in its depth, to divide the substrate into individual product forming areas (S310). As a result of this dicing work there are produced plural such semiconductor devices 60 as shown in FIG. 15.

In such a semiconductor device manufacturing method, however, the back side of the wafer is subjected to back grinding to reduce the wafer thickness to 100 µm or less which is much thinner than the conventional 400 μm. Such an extremely thin wafer is apt to be cracked or chipped and is difficult to handle.

Further, in the chip bonding step, a push-up pin is pushed up from below the dicing tape to let each semiconductor chip float and each semiconductor chip is picked up while being vacuum-chucked to a lower surface of a collet which is brought down. Each semiconductor chip when handled by the collet is apt to be cracked or chipped because it is as thin as 100 μm or less. Besides, since the chip holding surface of the collet comes into direct contact with the semiconductor chip, the chip surface is apt to be flawed.

It is an object of the present invention to make an extremely thin semiconductor wafer difficult to be cracked or chipped and thereby improve the production yield of a semiconductor device.

It is another object of the present invention to prevent the occurrence of cracking and chipping of a semiconductor chip during handling of the chip such as during manufacture and mounting of the chip and thereby provide a method of manufacturing a less expensive semiconductor device.

A typical mode of the present invention as disclosed herein will be outlined below.

(1) A method of manufacturing a semiconductor device which comprises providing a semiconductor wafer and a wiring substrate on a main surface of which are formed product forming areas orderly in longitudinal and transverse rows, covering a main surface of the wafer with a protective tape which is a heat-resistant, transparent, adhesive tape, grinding (back grinding) a back side of the wafer into a wafer thickness of 100 μm or less, affixing the wafer through the back side thereof to a dicing tape which is supported by a frame, dicing the main surface side of the wafer to a halfway depth of the dicing tape, including the protective tape, with a dicing blade to form plural semiconductor chips supported by the dicing tape, picking up the semiconductor chips on the dicing tape one by one and carrying and fixing each of the chips to a semiconductor chip fixing portion in each product forming area on the semiconductor wafer by means of a vacuum chuck type collet, removing the protective tape affixed to the main surface of each semiconductor chip, connecting electrodes on the semiconductor chips with wiring lines on the wiring substrate through electrically conductive wires, forming an insulating resin layer on the main surface of the wiring substrate so as to cover the semiconductor chips and the wires, affixing a support member to a main surface of the insulating resin layer, thereby allowing the support member to support the wiring substrate, dicing the wiring substrate along boundaries between adjacent product forming areas and from the substrate to a halfway depth of the support member through the insulating resin layer by means of the dicing blade, and peeling the product forming areas from the support member. After the formation of the insulating resin layer, salient electrodes (bump electrodes) are formed on wiring line surfaces on a back side of the wiring substrate. The semiconductor device is manufactured so as to be 0.5 mm or less in thickness by selecting a suitable thickness of the insulating resin layer.

According to the above means (1) there are obtained the following effects.

(a) Since the main surface of the wafer is covered with the protective tape, it is difficult to be stained or flawed during handling of the wafer. Moreover, the protective tape not only protects the main surface of the wafer but also functions as a strengthening member. As a result, cracking and chipping become difficult to occur during wafer handling. This is more effective for the wafer which has become thinner by back grinding.

(b) Since the main surface of the wafer is protected with the protective tape, when dicing is performed with the dicing blade, not only surface contamination can be prevented, but also cut edges and chip surfaces become difficult to be damaged. As a result, cracking and chipping of each semiconductor chip become difficult to occur and the quality of the chip and the production yield thereof are improved.

(c) Since the main surface of each semiconductor chip is protected with the protective film even after the dicing, it is possible to prevent contamination and flaw of the chip surface. Besides, since the protective film serves as a strengthening member, the semiconductor chip becomes difficult to be damaged when picked up, that is, when pushed up with the push-up pin and also when vacuum-chucked, conveyed and fixed by means of the collet.

(d) Since the wiring substrate is diced together with the resin layer after forming the insulating resin layer, a large number of semiconductor devices-can be manufactured at a time and hence it is possible to reduce the semiconductor device manufacturing cost.

(e) Since the thickness of each semiconductor chip is not larger than 100 μm, the resulting semiconductor device can be made as thin as 0.5 mm or less by thinning the resin layer.

DETAILED DESCRIPTION OF A PREFERRED EMBODIMENT

Figure 1:
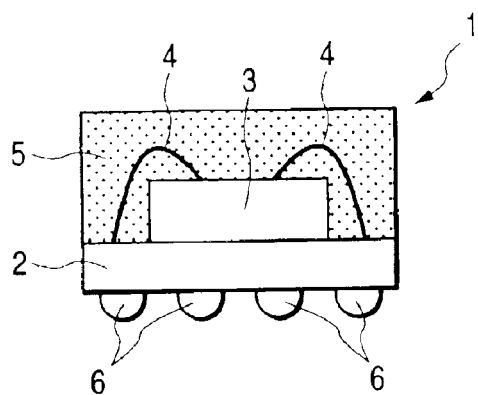
FIG. 1 is a sectional view of a semiconductor device fabricated by a semiconductor device manufacturing method according to an embodiment (first embodiment) of the present invention.

An embodiment of the present invention will be described in detail hereinunder with reference to the accompanying drawings. In all of the drawings for illustrating the embodiment, components having the same functions are denoted by the same reference numerals, so repeated explanations thereof will be omitted.

(First Embodiment)

FIGS. 1 to 14 illustrate a semiconductor device manufacturing method according to an embodiment (first embodiment) of the present invention, of which FIG. 1 is a schematic sectional view of a semiconductor device used in the first embodiment and FIGS. 2 to 14 illustrate how to fabricate the semiconductor device.

FIG. 1 is a schematic sectional view of a semiconductor device 1 fabricated by the semiconductor device manufacturing method of the first embodiment.

As shown in FIG. 1, the semiconductor 1 is made up of a substrate 2 of a wiring substrate structure, a semiconductor chip 3 fixed to a main surface (upper surface in the figure) of the substrate 2, electrically conductive wires 4 for connecting electrodes (not shown) formed on a surface of the semiconductor chip 3 with wiring lines (not shown) formed on the main surface of the substrate 2, a seal member 5 which is formed of an insulating resin on the main surface of the substrate 2 so as to cover the semiconductor device 1 and the wires 4, and bump electrodes (salient electrodes) 6 formed on a back side of the substrate 2. The bump electrodes 6 are formed on wiring lines (not shown) provided on the back side of the substrate 2. Since peripheral faces of the substrate 2 and seal member 5 are cut faces with a dicing blade, they are positioned on the same plane on each side.

The substrate 2 is about 100 $\mu$m thick, the semiconductor chip 3 is about 100 $\mu$m thick, the seal member 5 is about 200 $\mu$m thick, a projecting length of each bump electrode 6 from the back side of the substrate 2 is about 100 $\mu$m, and the semiconductor device 1 is as thin as 0.5 mm or less.

Figure 2:
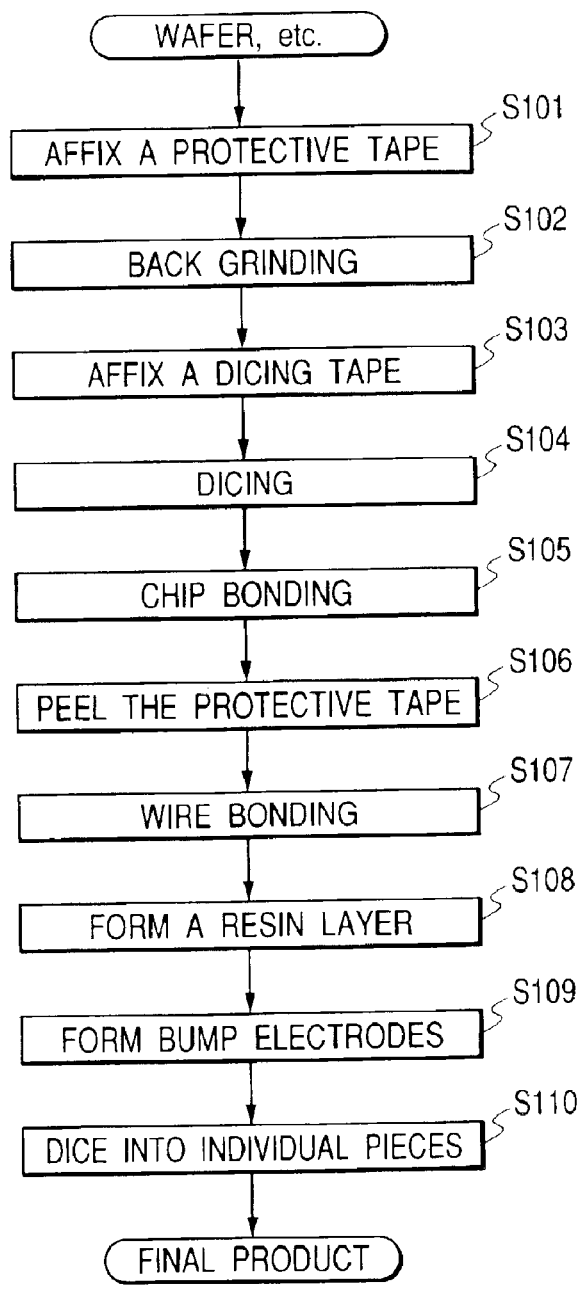
FIG. 2 is a flow chart illustrating the semiconductor device manufacturing method of the first embodiment.

As shown in a flow chart of FIG. 2, the semiconductor device 1 is fabricated through the steps of providing a wafer, affixing of a protective film (S101), back grinding (S102), affixing of a dicing tape (S103), dicing (S104), chip bonding (S105), peeling the protective tape (removal: S106), wire bonding (S107), forming a resin layer (S108), forming bump electrodes (S109), and dicing into individual pieces as final products (S110).

Next, a description will be given about how to fabricate the semiconductor device in accordance with the above steps. First, a semiconductor wafer 3a and a wiring substrate 2a are provided.

Though not shown, the wafer 3a is circular and is partially cut linearly to provide a direction identifying face (OFF). Semiconductor chip portions are formed orderly in longitudinal and transverse rows along the face OFF. The semiconductor chip portions are portions which afford rectangular semiconductor chips, with predetermined circuit components being formed thereon. Electrodes (not shown) are exposed from main surfaces (upper surfaces in the figure) of the semiconductor chip portions. The wafer 3a is, for example, 750 $\mu$m thick and 8 inches in diameter. The dotted line shown in FIG. 3 represents a final grinding position after back grinding.

Figure 7:
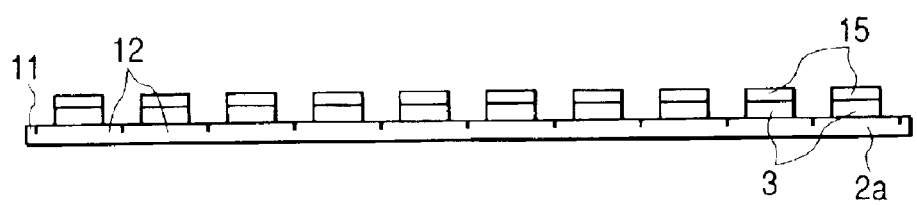
FIG. 7 is a schematic sectional view showing a state in which semiconductor chips are arranged in order on the wiring substrate in the semiconductor device manufacturing method of the first embodiment.
Figure 8:
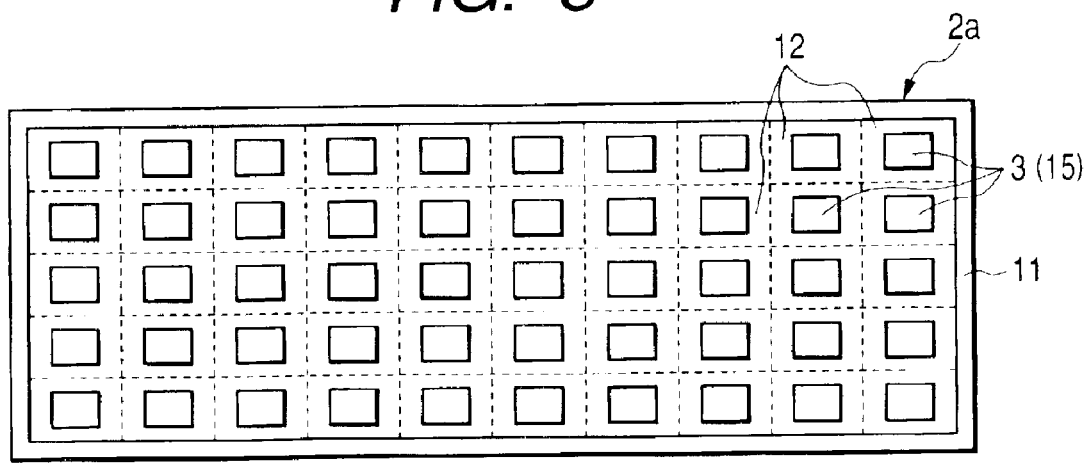
FIG. 8 is a schematic plan view thereof.

On the other hand, as shown in FIGS. 7 and 8, the wiring substrate 2a, when viewed in plan, is made up of a peripheral frame portion 11 and a group of product forming areas 12 located inside the frame portion 11. Each product forming area 12 is for fabricating one semiconductor device 1. As shown in FIG. 8, the product forming areas 12 are arranged on a main surface of the wiring substrate 2a orderly in longitudinal and transverse rows. In each product forming portion 12, though not shown, wiring lines are provided on both a main surface thereof and a back side thereof opposite to the main surface. The wiring lines on the main surface and the back side are electrically connected with each other through a conductor which is filled so as to penetrate the substrate 2a. The main surface of the wiring substrate 2a is a surface to which semiconductor chips are fixed, while on the back side thereof are formed external electrode terminals such as bump electrodes. The wiring substrate 2a is constituted by a resinous wiring substrate such as a glass fabric-based epoxy resin substrate.

Figure 3:
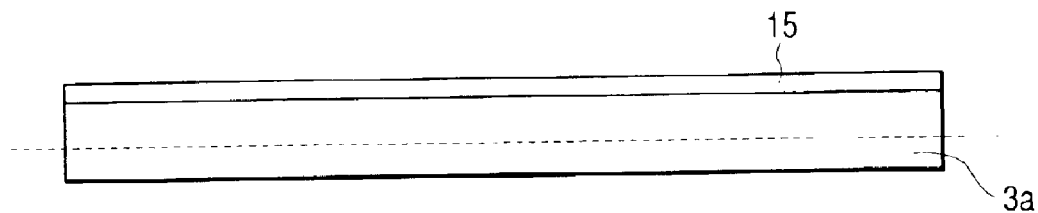
FIG. 3 is a schematic diagram of a wafer with a protective film affixed to a main surface of the wafer in the semiconductor device manufacturing method of the first embodiment.

Next, as shown in FIG. 3, a protective tape 15 is affixed to the whole of a main surface 3a of the wafer 3a (S101: see FIG. 3). The protective tape 15 is transparent so that dicing lines, etc. formed on the main surface of the wafer 3a can be seen during dicing, and it is a heat-resistant tape (heat-resisting temperature: about 200° C.) so that it can fully withstand heat in each semiconductor device manufacturing step. The protective tape 15 has an adhesive tape on one surface thereof. Further, the protective tape 15 is about 100 $\mu$m thick, acting as a strengthening member. As the protective tape 15 there is used a polyimide resin tape for example.

A heat-resistant, ultraviolet curing type tape may be used as the protective tape 15. In this case, the ultraviolet curing tape is affixed to the main surface of the wafer 3a, and when it is to be removed, ultraviolet light is radiated to the ultraviolet curing tape, allowing the bonded portion to cure and thereby causing the adhesion to be deteriorated. Thereafter, the ultraviolet curing tape is removed (peeled).

Since the main surface of the wafer 3a is covered with the protective tape 15, it is difficult to be stained or flawed during handling of the wafer 3a. Besides, the protective tape 15 not only protects the main surface of the wafer 3a but also serves as a strengthening member. As a result, it becomes difficult for cracking and chipping to occur during wafer handling.

Then, a back side of the wafer 3a is subjected to grinding (back grinding: BG) in such a manner that the wafer thickness is reduced from 750 $\mu$m to 100 $\mu$m (S102). Also during this back grinding, the wafer 3a, which is insufficient in strength, is reinforced by the protective tape 15. This reinforcement is more effective for the wafer which has become thinner by back grinding.

Figure 4:
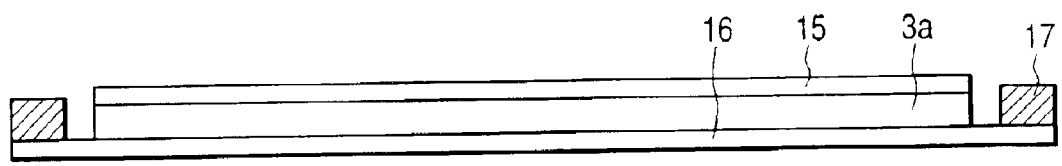
FIG. 4 is a schematic diagram of the wafer after back grinding and affixed to a dicing tape in the semiconductor device manufacturing method of the first embodiment.
Figure 5:
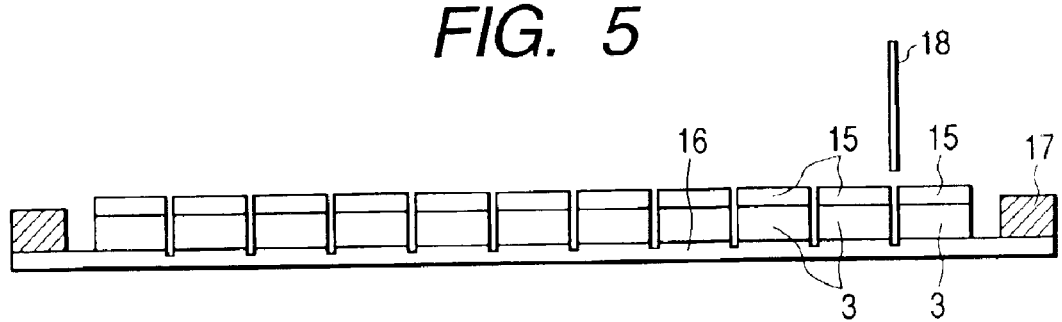
FIG. 5 is a schematic diagram of the wafer, showing in what state the wafer is diced with a dicing blade, in the semiconductor device manufacturing method of the first embodiment.
Figure 6A:
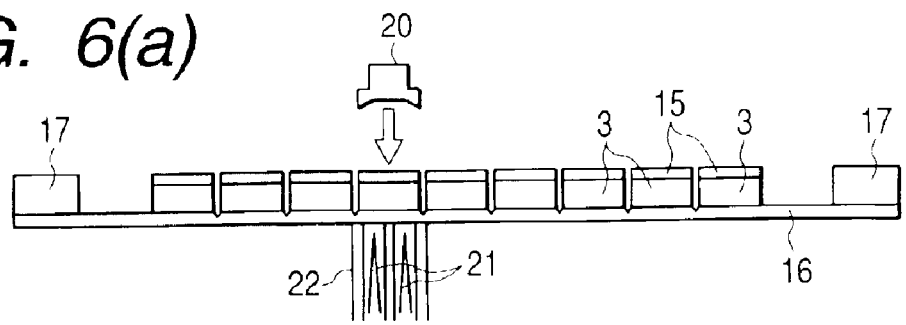
FIG. 6 is a schematic diagram showing in what state a semiconductor chip is picked up from the dicing tape and is bonded to a wiring substrate in the semiconductor device manufacturing method of the first embodiment.
Figure 6B:
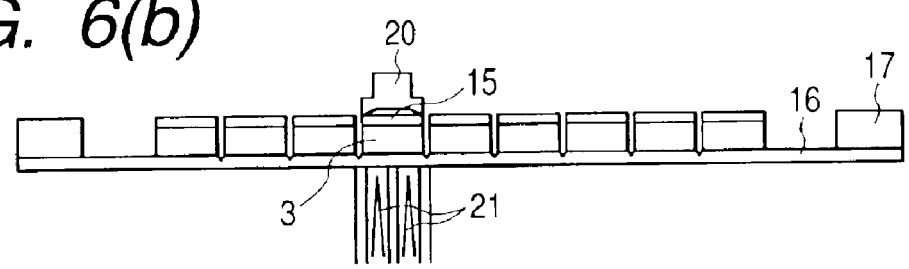
Figure 6C:
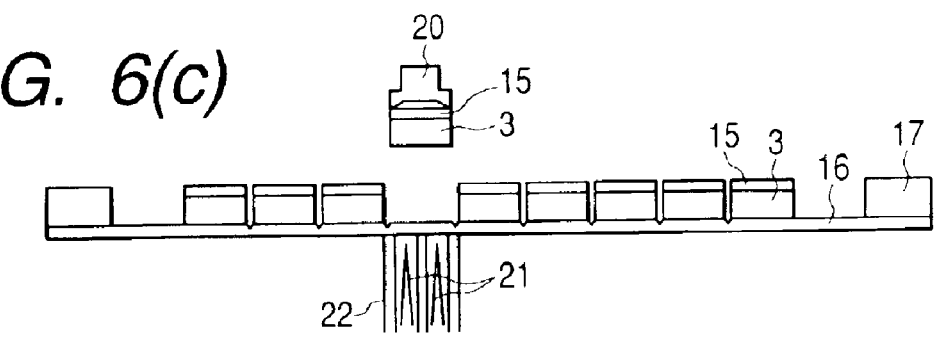
Figure 6D:
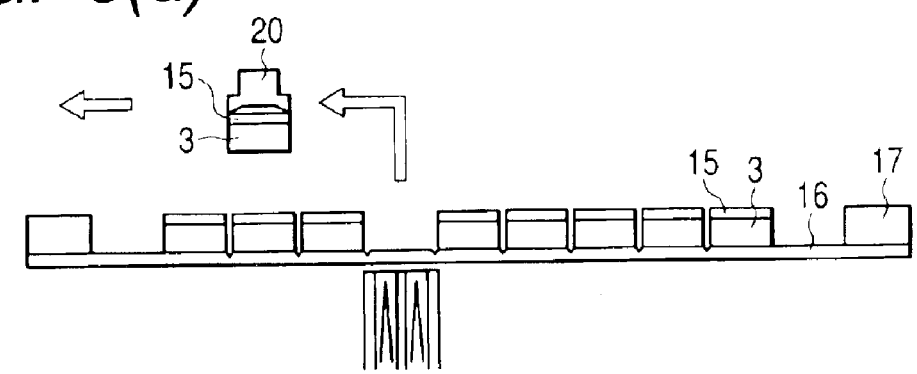

Next, as shown in FIG. 4, the wafer 3a is affixed through the back side thereof to a commonly-used dicing tape 16 (S103). An outer periphery portion of the dicing tape 16 is affixed to a support frame 17. Thereafter, as shown in FIG. 5, the wafer 3a is cut longitudinally and transversely with a dicing blade 18 (dicing: S104). The dicing with the dicing blade 18 is carried out along boundaries of semiconductor chip portions which are formed orderly in longitudinal and transverse rows on the wafer 3a. That is, the dicing is carried out in a lattice shape. More specifically, first the wafer is cut in a first direction in a successive manner and then cut in a second direction orthogonal to the first direction in a successive manner to complete the lattice-like cutting.

The dicing is performed so that the dicing tape 16 is cut halfway in its depth. Therefore, each semiconductor chip 3 after separation by dicing is in an affixed and supported state on the dicing tape 16.

Although the protective tape 15 is also cut by the dicing, it remains affixed to each semiconductor chip 3 and therefore the main surface of the chip is protected by the protective tape 15. During the dicing work with the dicing blade 18, the surfaces of the wafer 3a and the semiconductor chips 3 formed by the dicing can be prevented from stain; besides, the cut edges and chip surfaces become difficult to be damaged and hence cracking and chipping of the chips becomes difficult to occur, whereby the quality and production yield of the semiconductor chips are improved.

Also after the dicing step, the surface (main surface) of each semiconductor chip 3 supported by the dicing tape 16 is protected with the protective tape 15.

Next, the semiconductor chips 3 on the dicing tape 16 are picked up one by one and carried and fixed respectively to semiconductor chip fixing portions of the product forming areas 12 on the wiring substrate 2a (chip bonding: S105). FIGS. 8 and 7 are a plan view and a sectional view, respectively, showing a state in which the semiconductor chips 3 with protective tape 15 are fixed (mounted) to the main surface of the wiring substrate 2a.

FIGS. 6(a) to 6(d) are schematic diagrams showing in what state each semiconductor chip 3 on the dicing tape 16 is picked up. To be more specific, a vacuum chuck type collet 20 is brought down from above the dicing tape 16 to a position just above a predetermined semiconductor chip 3 and then the chip 3 is drawn near a holding face which is a recessed face of a quadrangular pyramid shape [see FIG. 6(b)].

Thereafter, plural push-up pins 21 positioned just under the collet 20 are raised to pierce the dicing tape 16 and push up the semiconductor chip 3. Interlockedly with this push-up operation the collet 20 is operated to vacuum-chuck the semiconductor chip 3 on its recessed face of a quadrangular pyramid shape [see FIG. 6(c)]. Subsequently, the collet 20 carries the semiconductor chip 3 to a predetermined place [see FIG. 6(d)].

The collet 20 carries the semiconductor chips 3 successively to the semiconductor chip fixing portions in the product forming areas 12 on the wiring substrate 2a and the chips 3 are fixed to the semiconductor chip fixing portions with a bonding material pre-fed between the fixing portions and the chips.

During this fixing work, the main surface of the semiconductor chip 3 concerned is supported at its peripheral edge by inclined sides of the recessed face of a quadrangular pyramid shape of collet 20, so that the chip 3 acts to approach the center of the collet at all times. Consequently, the position where the semiconductor chip 3 is to be fixed is accurately determined correspondingly to the position where the collet 20 stops relative to the wiring substrate 2a. Moreover, since the collet 20 can chuck the semiconductor chip 3 on its recessed face of a rectangular pyramid shape, it is possible to let the collet 20 oscillate in parallel with the main surface of the wiring substrate 2a and fix the semiconductor chip. For fixing the semiconductor chip 3 there is used, for example, a paste material such as silver paste, an gold-tin alloy layer, or a gold-silicon alloy layer.

Since the push-up pins 21 are fine pins, they are guided by guides 22 while moving up and down so as not to be bent or damaged.

In FIG. 8, solid lines and broken lines drawn around the semiconductor chips represent cutting lines to be described later, and a square area which surrounds each semiconductor chip 3 represents each product forming area 12. V grooves or the like may be formed beforehand along those solid and broken lines so as to permit easy cutting at the time of dicing the wiring substrate 2a into individual product forming areas 12.

Next, the protective tape 15 on the surface of each semiconductor chip 3 fixed to the main surface of the wiring substrate 2a is removed (peeled) (S106). In FIG. 9 there are shown three examples of means for removing the protective tape 15.

Figure 9A:
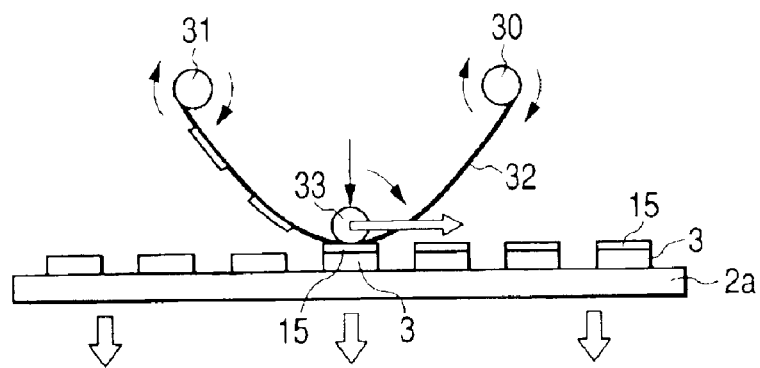
FIG. 9 is a schematic diagram showing how to remove the protective tape affixed to each semiconductor chip in the semiconductor device manufacturing method of the first embodiment.

According to a first protective tape removing means, which is shown in FIG. 9(a), there is used an adhesive tape 32 which is unwound from a tape unwind reel 30 and is wound onto a tape take-up reel 31. The adhesive tape 32 is pushed against the protective tape affixed to the main surface of a predetermined semiconductor chip 3 which is fixed to the main surface of the wiring substrate 2a, allowing the protective tape 15 to be bonded to the adhesive tape 32, and thereafter the adhesive tape 32 is separated from the semiconductor chip 3 relatively, whereby the protective tape 15 can be removed from the semiconductor chip.

More specifically, a movable roller 33 is brought into pressure contact, as indicated with arrow, with a back side of the adhesive tape 32 which has been unwound from the tape unwind reel 30, and the movable roller 33 is moved and rotated as indicated with arrows (thin and thick line arrows), causing the adhesive tape 32 to be pushed against the protective tape 15 on the semiconductor chip 3 and allowing the protective tape 15 to be bonded to the adhesive tape 32, to thereby peel the protective tape from the main surface of the semiconductor chip.

In this case, there can be adopted a method wherein the tape unwind reel 30 and the tape take-up reel 31 are arranged beyond the length of the wiring substrate 2a and the movable roller 33, which is an elongated roller, is moved under rotation over the adhesive tape 32 having been unwound from the left to the right end of the wiring substrate 2a, whereby the protective tape 15 which has covered the main surface of each semiconductor chip 3 can be bonded to the back side of the adhesive tape 32. According to this method, by causing the wiring substrate 2a to descend by a predetermined vertical distance, it is possible to peel off the protective tape 15 affixed to the semiconductor chips 3.

According to this peeling means, a bonding force of the adhesive tape 32 is set larger than that of the protective film for each semiconductor chip 3, then the protective tape 15 is bonded to the adhesive tape 32 and is peeled from the semiconductor chip.

Figure 9B:
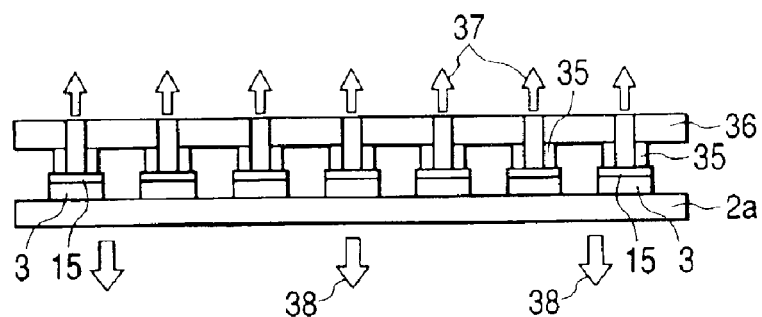

According to a second protective tape removing means, as shown in FIG. 9(b), there is provided a vacuum suction jig 36 having vacuum suction nozzles 35 corresponding to the semiconductor chips 3 on the product forming areas 12 of the wiring substrate 2a, then tips of the nozzles 35 are put on the protective tapes 15 on the semiconductor chips 3, followed by vacuum suction as indicated with arrows 37 to hold the protective tapes 15 on the vacuum suction nozzles 35. Subsequently, the vacuum suction jig 36 is moved away from the wiring substrate 2a as indicated with arrows 38 to peel (remove) the protective tapes 15 from the main surfaces of the semiconductor chips 3.

According to this peel means, a vacuum suction force of the vacuum suction nozzles 35 is set larger than the bonding force of the protective tapes 15 for the semiconductor chips 3 and the protective tapes are sucked in by the vacuum suction nozzles 35 to peel the protective tapes from the semiconductor chips.

Figure 9C:
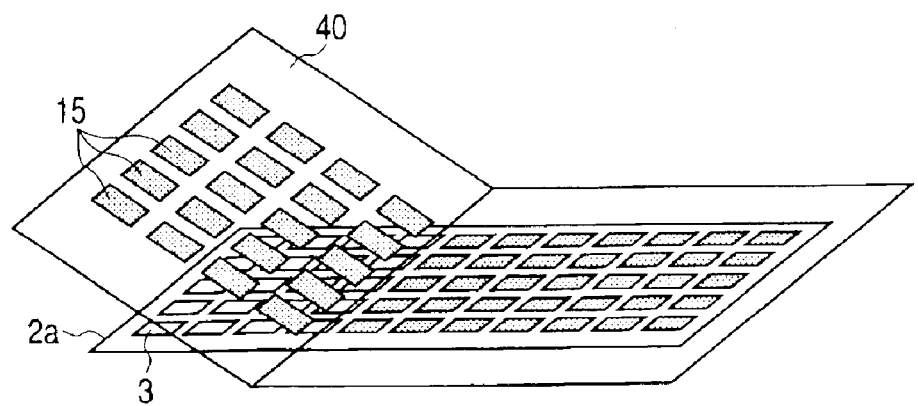

According to a third protective tape removing means, as shown in FIG. 9(c), a single adhesive tape 40 is bonded to the protective tapes 15 on the main surface side of all the semiconductor chips 3 as fixed to the wiring substrate 2a and is thereafter moved away from the wiring substrate 2a (semiconductor chips 3), thereby peeling the protective tapes 15 from the semiconductor chips 3. Thus, a bonding force of the adhesive tape 40 is set larger than that of the adhesive tapes 15 for the semiconductor chips 3, then the protective tapes 15 are bonded to the adhesive tape 40 and are peeled from the semiconductor chips 3.

In case of using an ultraviolet curing tape as the protective tape, ultraviolet light is radiated to the protective tape to weaken the bonding force of the protective tape and thereafter the peeling of the protective tape is performed. It goes without saying that the above three peeling means are employable for the tape peeling work.

Figure 10:
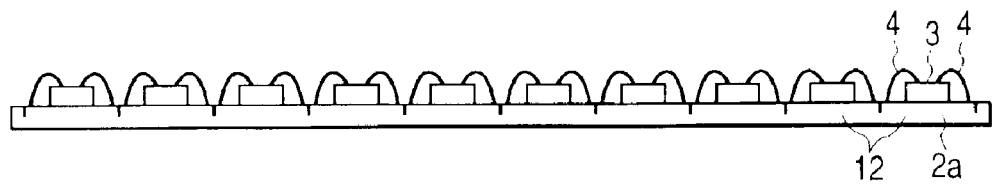
FIG. 10 is a schematic sectional view showing a state in which wiring lines on the wiring substrate and electrodes on each semiconductor chip are connected together using wires in the semiconductor device manufacturing method of the first embodiment.
Figure 11:
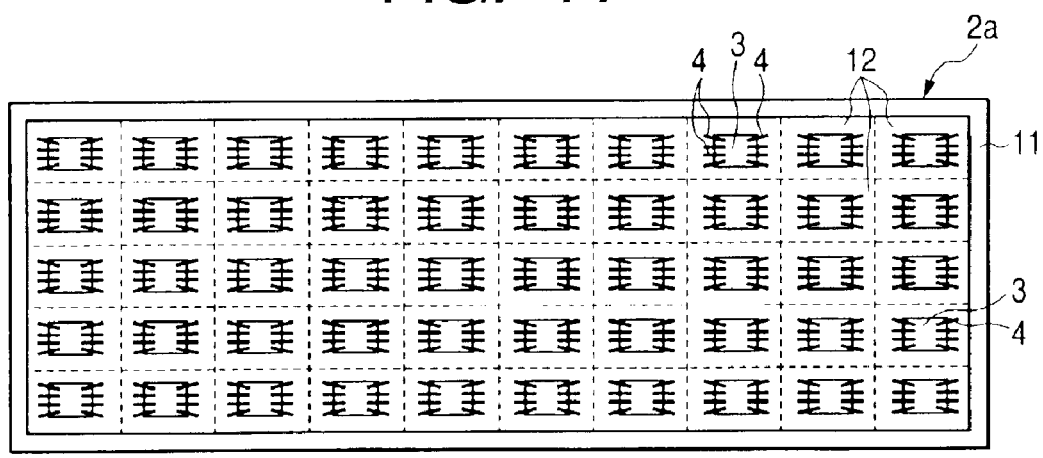
FIG. 11 is a schematic plan view thereof.

Next, electrodes (not shown) formed on the semiconductor chips 3 and wiring lines (not shown) formed on the wiring substrate 2a are connected together using electrically conductive wires 4 (wire bonding: S107). FIGS. 11 and 10 are a schematic plan view and a schematic sectional view, respectively, showing a state in which the wiring lines on the wiring substrate 2a and the electrodes on the semiconductor chips 3 are connected together using wires 4.

Figure 12:
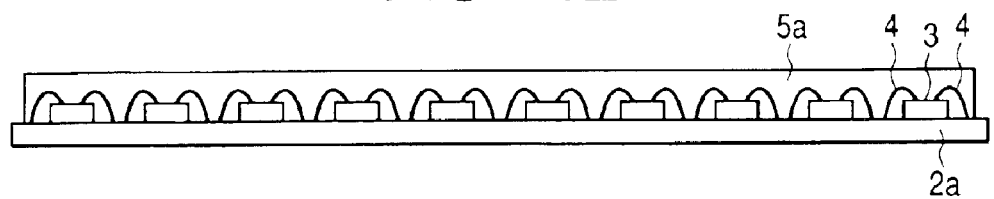
FIG. 12 is a schematic sectional view of the wiring substrate, showing a state in which an insulating resin layer is formed on a main surface of the wiring substrate, in the semiconductor device manufacturing method of the first embodiment.
Figure 13:
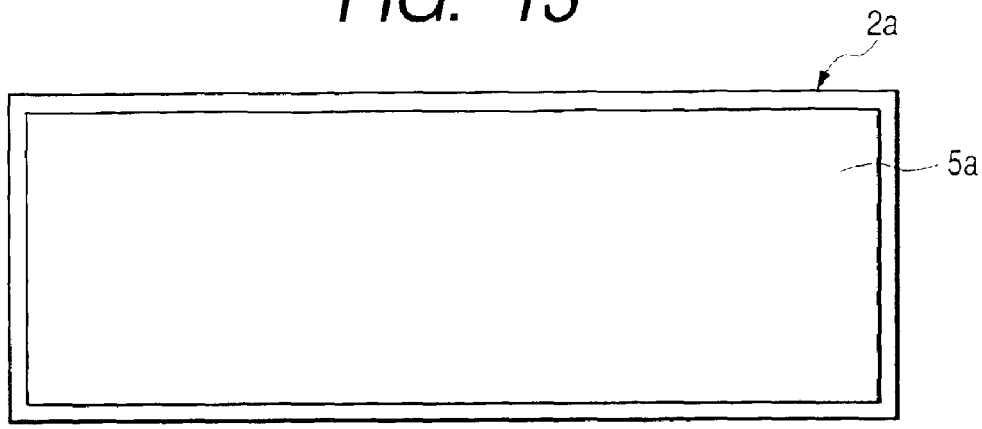
FIG. 13 is a schematic plan view thereof.

Then, an insulating resin layer 5a is formed on the main surface of the wiring substrate 2a so as to cover the semiconductor chips 3 and the wires 4 (forming a resin layer: S108). FIGS. 13 and 12 are a schematic plan view and a schematic sectional view, respectively, of the wiring substrate 2a, showing a state in which the insulating resin layer 5a was formed on the main surface of the substrate 2a.

The insulating resin layer 5a is formed by one-side molding in accordance with a transfer molding method using an epoxy resin for example. In this case, a suitable thickness of the insulating resin layer 5a is selected so as to give a thickness of the semiconductor device 1 of 0.5 mm or less.

Figure 14:
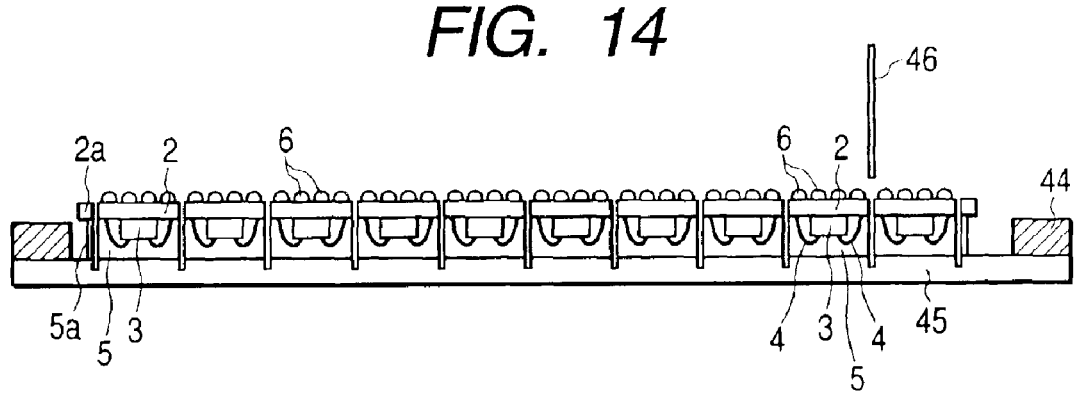
FIG. 14 is a schematic sectional view showing a state in which the wiring substrate and the insulating resin layer are cut in the semiconductor device manufacturing method of the first embodiment.
Figure 15:
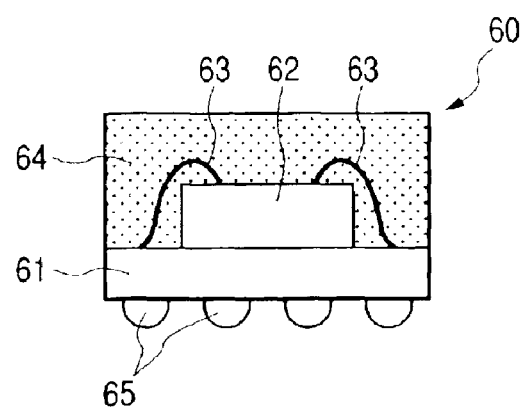
FIG. 15 is a schematic sectional view of a semiconductor device studied prior to the present invention.
Figure 16:
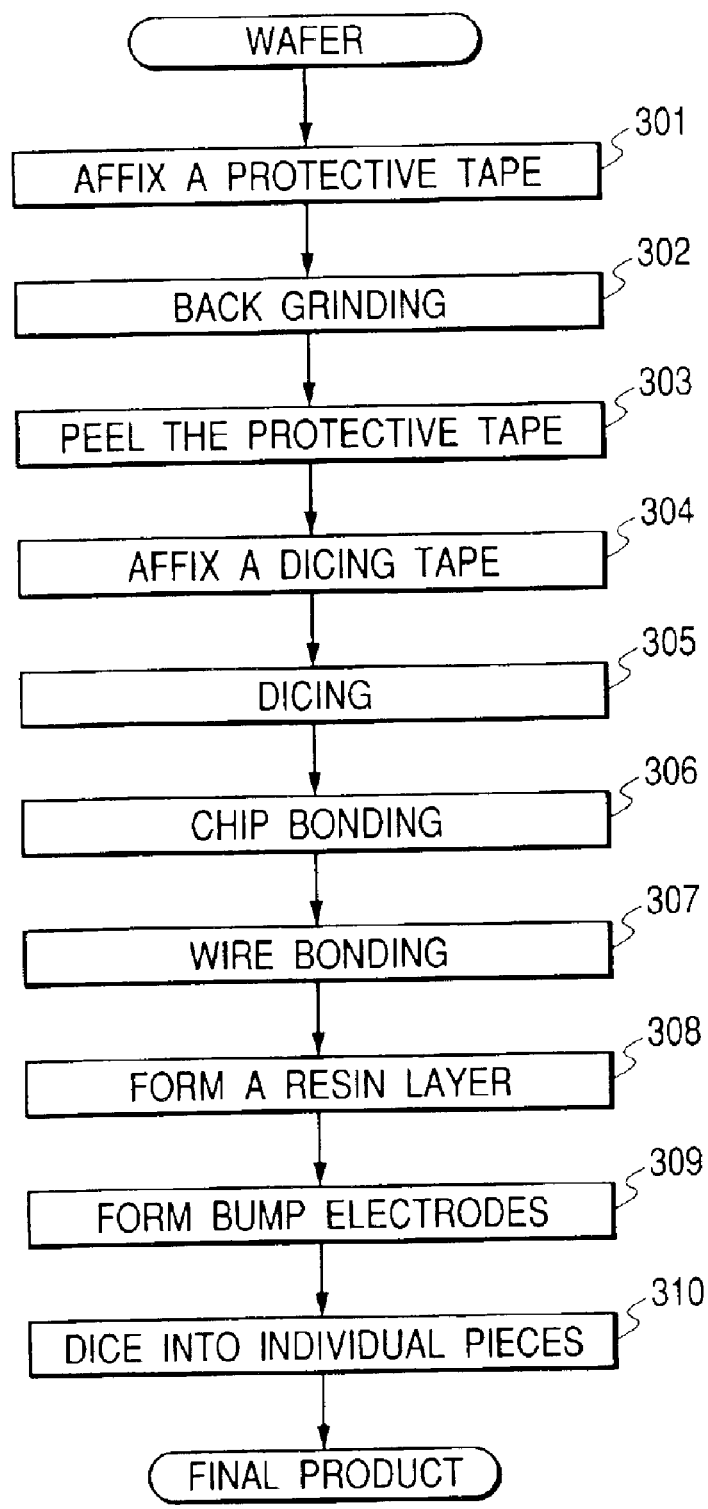
FIG. 16 is a flow chart showing how to fabricate the semiconductor device of FIG. 15.

Next, bump electrodes (salient electrodes) 6 are formed on a back side of the wiring substrate 2a (see FIG. 14: S109). More specifically, the bump electrodes 6 are formed on wiring lines (not shown) formed on the back side of the wiring substrate 2a.

Then, as shown in FIG. 14, a support member (adhesive tape) 45 affixed to a support frame 44 is affixed to the main surface of the wiring substrate 2a and dicing is performed along boundaries between adjacent product forming areas to cut from the wiring substrate 2a to a halfway depth of the support member 45 through the insulating resin layer 5a, thereby making division into individual product forming areas to form semiconductor devices 1 (S110). The semiconductor devices 1 thus separated from one another are each in an affixed state to the support member 45. Therefore, by removing (peeling) each semiconductor device 1 from the support member 45, such a semiconductor device 1 as shown in FIG. 1 is produced in a plural number.

Each of the peripheral faces of the square substrate 2 of each semiconductor device 1 and each of peripheral faces of the seal member 5 corresponding to the substrate peripheral face are flush with each other, providing a flat face, because the wiring substrate 2a and the insulating resin layer 5a are cut with the dicing blade.

The following effects are obtained by this first embodiment.

(1) Since the main surface of the wafer 3a is covered with the protective tape 15, the wafer main surface becomes difficult to be stained or flawed during handling of the wafer. Besides, the protecting tape 15 not only protects the main surface of the wafer 3a but also serves as a strengthening member. As a result, cracking and chipping become difficult to occur during handling of the wafer. This is more effective for the wafer 3a after having been made thinner by back grinding.

(2) Since the main surface of the wafer is protected by the protective tape 15, not only it is possible to prevent stain of the wafer surface during the cutting work with the dicing blade 18, but also cut edges and the surfaces of the semiconductor chip portions become difficult to be damaged. As a result, the semiconductor chips 3 become difficult to be cracked or chipped and the quality and production yield thereof are improved.

(3) In the dicing step, the wafer 3a is sandwiched in between the dicing tape 16 and the protective tape 15 and in this state dicing is performed, so that cracking and chipping of the semiconductor chips 3 in the dicing step are difficult to occur and it becomes difficult for the semiconductor chips to warp. Since each semiconductor chip 3 with its main surface protected by the protective tape 15 and its back side affixed to the dicing tape 16 is picked up and fixed to the wiring substrate 2a, cracking and chipping of the chip 3 are difficult to occur and hence it is possible to improve the production yield.

(4) Since the main surface of the wafer 3a is covered with the protective tape 15 which is transparent, it becomes easier to visually check the dicing lines at the time of dicing the wafer 3a and hence both dicing work efficiency and dicing yield can be improved.

(5) Since the main surface of each semiconductor chip 3 remains protected with the protective tape 15 even after dicing, the chip surface can be prevented from being stained or damaged. Besides, since the protective tape 15 serves as a strengthening member, each semiconductor chip 3 is difficult to be damaged when pushed up with push-up pins 21 during pick-up of the chip and also during vacuum chucking, conveyance and fixing of the chip by the collet 20.

(6) Since the wiring substrate 2a is cut together with the insulating resin layer 5a after formation of the same layer, it is possible to manufacture a large number of semiconductor devices 1 at a time and hence possible to reduce the semiconductor device manufacturing cost.

(7) Since each semiconductor chip 3 is 100 μm or less in thickness, each of the resulting semiconductor devices 1 can be made as thin as 0.5 mm or less by thinning the resin layer.

Although the present invention has been described above concretely by way of an embodiment thereof, it goes without saying that the invention is not limited to the above embodiment and that various changes may be made within the scope not departing from the gist thereof. Although in the above embodiment a single semiconductor chip is mounted in each product forming area, the invention is also applicable to a construction in which plural semiconductor chips are mounted in each product forming area. Where required, even such passive components as chip capacitor and chip resistor may be mounted on each product forming area.

Further, although in the above embodiment bump electrodes are provided on the back side of the substrate, there may be adopted another structure of external electrode terminals.

The following is an outline of effects obtained by the typical mode of the present invention as disclosed herein.

(1) Since cracking and chipping of a thin wafer can be prevented, it is possible to improve the semiconductor device manufacturing yield.

(2) Since it is possible to prevent the occurrence of cracking and chipping of each semiconductor chip during handling of the chip such as during manufacture and mounting of the chip, it is possible to attain the reduction of the semiconductor device manufacturing cost.

What is claimed is:

1. A method of manufacturing a semiconductor device, comprising the steps of:

preparing a semiconductor wafer having a plurality of areas respectively formed with integrated circuits, spaced from each other by dicing areas, and arranged orderly in a matrix on a main surface thereof, and a wiring substrate with a plurality of mounting areas arranged orderly on a main surface thereof, having wiring lines formed on the main surface and on a backside surface of the wiring substrate at each of the mounting areas, the wiring lines on the main surface and on the back side surface of the wiring substrate being interconnected by conductors penetrating the wiring substrate;

affixing a protective tape so as to cover an entire area of the main surface of the semiconductor wafer;

removing the back side of the semiconductor wafer by a predetermined thickness while the entire area of the main surface of the semiconductor wafer is covered with the protective tape;

affixing a dicing tape to the back side of the semiconductor wafer exposed by the removing step;

while the main surface of the semiconductor wafer is covered with the protective tape, cutting the semiconductor wafer along said dicing areas from the main surface of the semiconductor wafer to a halfway depth of the dicing tape by means of a dicing blade to divide the semiconductor wafer into a plurality of individual semiconductor chips;

picking up the semiconductor chips on the dicing tape one by one and fixing the semiconductor chips to the mounting areas of said wiring substrate, respectively;

removing the protective tape from each of the semiconductor chips affixed to the wiring substrate;

connecting electrodes formed on the semiconductor chip at each of the mounting areas of said wiring substrate with the associated wiring lines formed on the main surface of the wiring substrate, by electrically conductive wires;

forming an insulating encapsulation material layer on the main surface of the wiring substrate so as to cover the semiconductor chips and the wires;

affixing a support member to the combination of the semiconductor chips and the wiring substrate through a main surface of the insulating encapsulation material layer;

forming salient or bump electrodes on wiring lines formed on the back side surface of the wiring substrate while said combination is supported by the support member;

dicing the combination along boundaries between the mounting areas of said wiring substrate from the wiring substrate to a halfway depth of the support member through the insulating encapsulation material layer by means of a dicing blade; and separating each of semiconductor devices having said individual semiconductor chips and said wiring substrate from the support member.

2. The method according to claim 1, wherein the protective tape is a heat-resistant, transparent, adhesive tape.

3. The method according to claim 1, wherein the protective tape is a heat-resistant, ultraviolet curing type tape, and after affixing the protective tape to the semiconductor wafer and before the removal thereof the protective tape is irradiated with ultraviolet light to cure its bonded portion, thereby deteriorating the adhesion of the protective tape.

4. The method according to claim 1, wherein the back side of the semiconductor wafer is removed by a predetermined thickness to form a semiconductor wafer having a thickness of not larger than about 100 $\mu$m.

5. The method according to claim 1, wherein the pick-up of each of the semiconductor chips on the dicing tape is performed by pushing up the semiconductor chip with a plurality of push-up pins adapted to push up from below the dicing tape toward the semiconductor chip and with use of a vacuum chuck type collet adapted to vacuum-chuck the pushed-up semiconductor chip.

6. The method according to claim 5, wherein the collet is a pyramidal collet having a recessed face of a rectangular pyramid shape as a chuck face, the semiconductor chip being picked up is held by the recessed face of a quadrangular pyramid shape, and the position where the semiconductor chip is to be fixed is determined by the recessed face of a quadrangular pyramid shape.

7. The method according to claim 1, wherein an adhesive tape is bonded to the protective tape affixed to the main surface of each of the semiconductor chips and is then moved away from the semiconductor chip to remove the protective tape from the semiconductor chip.

8. The method according to claim 7, wherein an adhesive tape adapted to be unwound from a tape unwind reel and be taken up onto a tape take-up reel is pushed against the protective tape, allowing the protective tape to be bonded to the adhesive tape, and thereafter the adhesive tape is moved away from the semiconductor chip relatively to remove the protective tape from the semiconductor chip.

9. The method according to claim 8, wherein a movable roller is brought into contact with a back side of the adhesive tape having been unwound from the tape unwind reel, and the adhesive tape is pushed against the semiconductor chip while allowing the movable roller to move under rotation, thereby causing the protective tape to be bonded to the adhesive tape.

10. The method according to claim 1, wherein a vacuum suction jig having vacuum suction nozzles corresponding to the semiconductor chips on the wiring substrate is provided, tips of the vacuum suction nozzles are put on the protective tape on the semiconductor chips, followed by vacuum suction to let the vacuum suction nozzles hold the protective tape, and thereafter the vacuum suction jig is moved away from the wiring substrate to remove the protective tape.

11. The method according to claim 1, wherein the thickness of the semiconductor device is adjusted to 0.5 mm or less by selecting a suitable thickness of the insulating encapsulation material layer.

12. The method according to claim 1, wherein a plurality of semiconductor chips are fixed to each of the mounting areas of said wiring substrate.

13. A method of manufacturing a semiconductor device, comprising the steps of:

preparing a semiconductor wafer having a plurality of areas respectively formed with integrated circuits, spaced from each other by dicing areas, and arranged orderly in a matrix on a main surface thereof, and a wiring substrate with a plurality of mounting areas arranged orderly on a main surface thereof, having wiring lines formed on the main surface and on a backside surface of the wiring substrate at each of the mounting areas, the wiring lines on the main surface and on the back side surface of the wiring substrate being interconnected by conductors penetrating the wiring substrate;

affixing a protective tape so as to cover an entire area of the main surface of the semiconductor wafer;

removing the back side of the semiconductor wafer to reduce the semiconductor wafer to a thickness of 100 μm or less while the entire area of the main surface of the semiconductor wafer is covered with the protective tape;

affixing a dicing tape to the back side of the semiconductor wafer exposed by the removing step;

while the main surface of the semiconductor wafer is covered with the protective tape, cutting the semiconductor wafer along said dicing areas from the main surface of the semiconductor wafer to a halfway depth of the dicing tape by means of a dicing blade to divide the semiconductor wafer into a plurality of individual semiconductor chips;

picking up the semiconductor chips on the dicing tape one by one using a plurality of push-up pins adapted to push up from below the dicing tape toward the semiconductor chips and fixing the pushed up semiconductor chips to the mounting areas of said wiring substrate, respectively;

removing the protective tape from each of the semiconductor chips affixed to the wiring substrate;

connecting electrodes formed on the semiconductor chip at each of the mounting areas of said wiring substrate with the associated wiring lines formed on the main surface of the wiring substrate by electrically conductive wires;

forming an insulating encapsulation material layer on the main surface of the wiring substrate so as to cover the semiconductor chips and the wires;

affixing a support member to the combination of the semiconductor chips and the wiring substrate through a main surface of the insulating encapsulation material layer;

dicing the combination along boundaries between the mounting areas of said wiring substrate from the wiring substrate to a halfway depth of the support member through the insulating encapsulation material layer by means of a dicing blade; and separating each of semiconductor devices having said individual semiconductor chips and said wiring substrate from the support member.

* * * * *